United States Patent
Tsuchiya

(10) Patent No.: US 8,766,334 B2
(45) Date of Patent: Jul. 1, 2014

(54) SEMICONDUCTOR DEVICE WITH LOW RESISTANCE GATE ELECTRODE AND METHOD OF MANUFACTURING THE SAME

(75) Inventor: Yoshinori Tsuchiya, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/602,704

(22) Filed: Sep. 4, 2012

(65) Prior Publication Data

US 2013/0234159 A1 Sep. 12, 2013

(30) Foreign Application Priority Data

Mar. 2, 2012 (JP) .................. 2012-046253

(51) Int. Cl.
| | |
|---|---|
| *H01L 29/76* | (2006.01) |
| *H01L 29/94* | (2006.01) |
| *H01L 27/01* | (2006.01) |
| *H01L 27/12* | (2006.01) |
| *H01L 27/088* | (2006.01) |
| *H01L 21/336* | (2006.01) |
| *H01L 21/8222* | (2006.01) |

(52) U.S. Cl.
USPC ........... 257/288; 257/350; 257/900; 438/197; 438/311

(58) Field of Classification Search
USPC ........... 257/77, 288, 350, 401, 900; 438/105, 438/931, 284, 286, 197, 152, 155, 156, 309, 438/311, 184, 230, 265, 303, 595
See application file for complete search history.

(56) References Cited

U.S. PATENT DOCUMENTS

| | | | |
|---|---|---|---|
| 7,012,007 B1 * | 3/2006 | Goo et al. ............ | 438/296 |
| 2011/0233560 A1 * | 9/2011 | Koike et al. ............ | 257/77 |

FOREIGN PATENT DOCUMENTS

JP 2009-253072 10/2009

* cited by examiner

*Primary Examiner* — Matthew Reames
*Assistant Examiner* — Dilinh Nguyen
(74) *Attorney, Agent, or Firm* — Oblon, Spivak, McClelland, Maier & Neustadt, L.L.P.

(57) ABSTRACT

A semiconductor device of an embodiment includes: a substrate formed of a single-crystal first semiconductor; a gate insulating film on the substrate; a gate electrode including a layered structure of a semiconductor layer formed of a polycrystalline second semiconductor and a metal semiconductor compound layer formed of a first metal semiconductor compound that is a reaction product of a metal and the second semiconductor; and electrodes formed of a second metal semiconductor compound that is a reaction product of the metal and the first semiconductor, and formed on the substrate with the gate electrode interposed therebetween, and an aggregation temperature of the first metal semiconductor compound on the polycrystalline second semiconductor is lower than an aggregation temperature of the second metal semiconductor compound on the single-crystal first semiconductor, and a cluster-state high carbon concentration region is included in an interface between the semiconductor layer and the metal semiconductor compound layer.

11 Claims, 17 Drawing Sheets

Carbon Atoms Distribution

Carbon 5% Isoconcentration Surface

FIG.13A  Without Carbon Ion Implantation
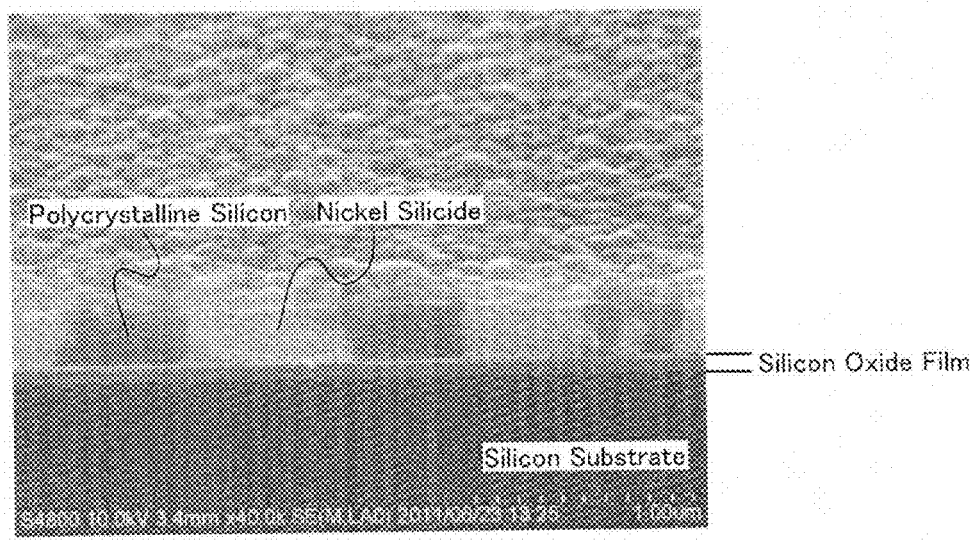
FIG.13B  With Carbon Ion Implantation
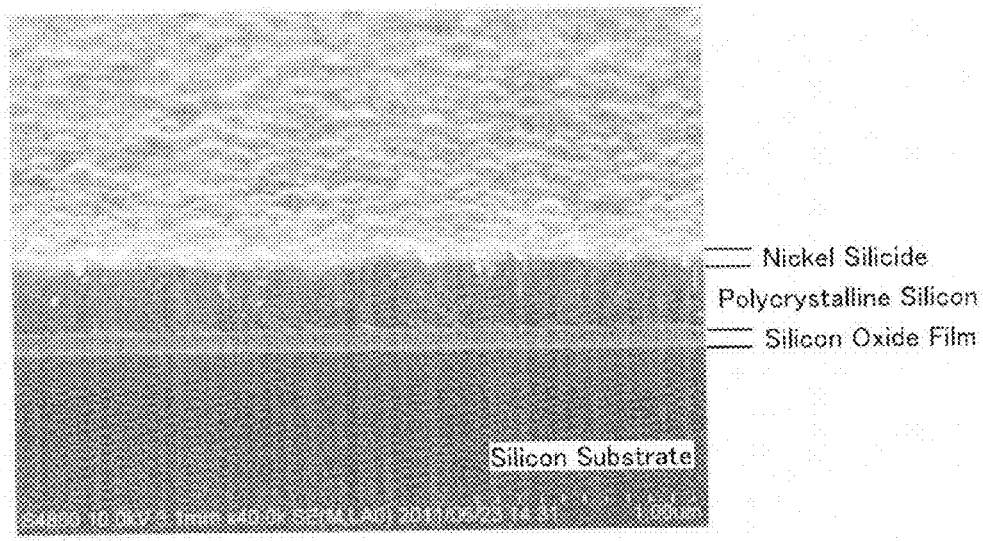

US 8,766,334 B2

SEMICONDUCTOR DEVICE WITH LOW RESISTANCE GATE ELECTRODE AND METHOD OF MANUFACTURING THE SAME

CROSS-REFERENCE TO RELATED APPLICATION

This application is based upon and claims the benefit of priority from Japanese Patent Application No. 2012-046253, filed on Mar. 2, 2012, the entire contents of which are incorporated herein by reference.

FIELD

Embodiments described herein relate generally to a semiconductor device and a method of manufacturing the same.

BACKGROUND

Silicon carbide (hereinafter, also represented as SiC) has drawn attention as a material for a next-generation power semiconductor device. SiC has breakdown electric field strength approximately ten times higher than silicon (hereinafter, also represented as Si) as well as thermal conductivity approximately three times higher than Si, and is capable of realizing a low-loss power semiconductor device operable at a high temperature, which is difficult to be realized by a Si power device.

For example, a high breakdown voltage power MOSFET has low on-resistance and a high breakdown voltage, and is also capable of realizing fast switching. Therefore, it is widely used as a switching element of a power circuit such as a switching power supply. The high breakdown voltage power MOSFET has a vertical MOSFET structure in which a source electrode, a gate electrode, and a well electrode are formed on a surface of a substrate, and a drain electrode is formed on a back surface of the substrate. Further, a double-implantation MOSFET (hereinafter, also represented as DIMOSFET) structure in which a channel forming region (well region) and a source region are formed on a surface of a substrate using ion implantation is an excellent device structure in which a channel region can be simply and accurately formed, and is also suitable for a parallel operation.

Although the high breakdown voltage power MOSFET is a suitable device for a high-speed operation, the fact that the gate electrode has high resistance is a technical problem for the realization of the high-speed operation when a DIMOSFET using a SiC substrate is formed. To realize the high-speed operation of the device, it is necessary to reduce the resistance of a poly-Si gate electrode. Therefore, typically, a silicide having low resistance is formed by an interfacial solid-phase reaction with a metal on an upper portion of the poly-Si.

However, there is a difference in process temperature for the formation of the silicide between on the polycrystalline silicon of the gate electrode and on the SiC substrate of the source electrode. Therefore, the formation of the silicide on the polycrystalline silicon and on the SiC substrate cannot be performed simultaneously. More specifically, in a case of the formation of a nickel silicide having a small specific resistance, a thermal process temperature required for the formation of the silicide of the source electrode is 650° C. or more. On the other hand, the nickel silicide on the polycrystalline silicon of the gate electrode causes an aggregation of a film in the thermal process of 650° C. or more, and therefore a gate electrode having sufficient low resistance cannot be formed due to an increase of sheet resistance of the gate electrode.

Further, a layered structure of the polycrystalline silicon and the nickel silicide may raise a concern of increasing the sheet resistance during a device operation under a high-temperature environment, and has also reliability concern.

BRIEF DESCRIPTION OF THE DRAWINGS

FIGS. 13A and 13B are SEM photographs of sections of a gate electrode structure after silicidation anneal according to the first embodiment;

DETAILED DESCRIPTION

Figure 1:
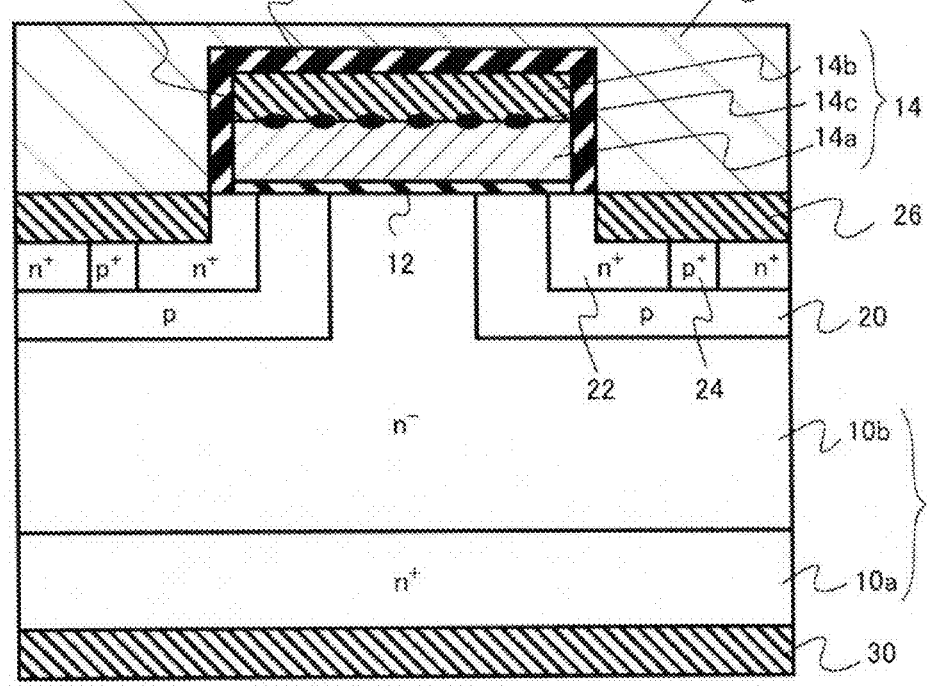
FIG. 1 is a schematic sectional view of a semiconductor device according to a first embodiment.

A semiconductor device according to an embodiment includes: a substrate formed of a single-crystal first semiconductor; a gate insulating film formed on the substrate; a gate electrode including a layered structure of a semiconductor layer formed of a polycrystalline second semiconductor and formed on the gate insulating film, and a metal semiconductor compound layer formed of a first metal semiconductor compound that is a reaction product of a metal and the second semiconductor; and electrodes formed of a second metal semiconductor compound that is a reaction product of the metal and the first semiconductor, and formed on the substrate with the gate electrode interposed therebetween, and an aggregation temperature of the first metal semiconductor compound on the polycrystalline second semiconductor is lower than an aggregation temperature of the second metal semiconductor compound on the single-crystal first semiconductor, and a cluster-state high carbon concentration region is included in an interface between the semiconductor layer and the metal semiconductor compound layer.

There are two types of resistance for a gate electrode of a transistor as a switching element: sheet resistance, and contact resistance between layers when a layered structure is employed for the gate electrode. For example, in a case of the layered structure of polycrystalline silicon and a nickel silicide, the sheet resistance is mainly defined by resistance of the nickel silicide. Also, the contact resistance is mainly defined by interface resistance between the polycrystalline silicon and the nickel silicide.

To realize a high-speed operation of a device, it is necessary to reduce both the sheet resistance and the contact resistance of the gate electrode. Further, to realize high reliability of the device, it is necessary that the layered structure of the gate electrode have high heat-resistance.

Embodiments of the present invention will be herein described with reference to the drawings.

First Embodiment

A semiconductor device according to the present embodiment includes: a substrate formed of a single-crystal first semiconductor; a gate insulating film formed on the substrate; a gate electrode including a layered structure of a semiconductor layer formed of a polycrystalline second semiconductor and formed on the gate insulating film, and a metal semiconductor compound layer formed of a first metal semiconductor compound that is a reaction product of a metal and the second semiconductor; and electrodes formed of a second metal semiconductor compound that is a reaction product of the metal and the first semiconductor, and formed on the substrate to interpose the gate electrode, and an aggregation temperature of the first metal semiconductor compound on the polycrystalline second semiconductor is lower than an aggregation temperature of the second metal semiconductor compound on the single-crystal first semiconductor, and a cluster-state high carbon concentration region is included in an interface between the semiconductor layer and the metal semiconductor compound layer.

A semiconductor device of the present embodiment includes the above-described structure, whereby the resistance of the gate electrode is reduced and the heat-resistance of the gate electrode is improved. Therefore, a high-speed operation and high reliability can be realized.

Note that, in the present specification, "aggregation temperature" means a temperature at which a metal semiconductor compound is aggregated and loses a continuous form as a film when the metal semiconductor compound is formed by a heat treatment to cause a reaction between a semiconductor and a metal. For example, the magnitude of the aggregation temperature of two types of the metal semiconductor compounds formed by the reaction between the semiconductor and the metal can be judged by the following way. In each of the combinations, the change of the sheet resistance is measured by changing the temperature under the same heat treatment condition, and the rates of increase of the sheet resistance with respect to the temperature are compared.

That is, the magnitude correlation of the aggregation temperature can be specified by specifying the type and the crystallinity of the semiconductor, and the type of the metal.

The semiconductor device of the present embodiment is an SiC-DIMOSFET. A case will be exemplarily illustrated, where a single-crystal first semiconductor is made of single-crystal silicon carbide (SiC), a polycrystalline second semiconductor is made of polycrystalline silicon, a metal is nickel (Ni), and first and second metal semiconductor compounds are a nickel silicide (hereinafter, also represented as NiSi).

The aggregation temperature of the nickel silicide on the polycrystalline silicon is lower than that of the nickel silicide on the single-crystal SiC. Therefore, there is a concern of increasing the resistance of the gate electrode at a lower temperature when the device is operated at a high temperature, and this is a problem from a viewpoint of reliability. The present embodiment provides a cluster-state high carbon concentration region at an interface between a polycrystalline silicon film and a nickel silicide film of the gate electrode, so that the heat-resistance is improved.

FIG. 1 is a schematic sectional view of the semiconductor device according to the present embodiment.

As shown in FIG. 1, a DIMOSFET 100 uses a SiC substrate 10 having single-crystal hexagonal 4H-SiC (first semiconductor) including an n$^+$-type SiC layer 10a, and an n$^-$-type SiC layer 10b having a lower n-type impurity concentration than the n$^+$-type SiC layer 10a.

The n$^+$-type SiC layer 10a includes, for example, an n-type impurity having the impurity concentration of approximately $1\times10^{18}$ to $1\times10^{19}$ cm$^{-3}$. The n-type impurity is, for example, nitrogen (N) or phosphorus (P). The n$^+$-type SiC layer 10a functions as a drain region of the DIMOSFET 100.

Also, the n$^-$-type SiC layer 10b is, for example, formed on the n$^+$-type SiC layer 10a using an epitaxial growth method. For example, the impurity concentration of the n-type impurity is approximately $1\times10^{15}$ to $1\times10^{17}$ cm$^{-3}$. The n-type impurity is, for example, nitrogen (N) or phosphorus (P). The thickness of the n$^-$-type SiC layer 10b is, for example, approximately 5 to 15 μm. The n$^-$-type SiC layer 10b functions as a drift region of the DIMOSFET 100.

A gate insulating film 12 is formed on the n$^-$-type SiC layer 10b. A silicon oxide film is applicable to the gate insulating film 12, for example. The film thickness of the silicon oxide film is desirably 10 nm or more and 160 nm or less.

Further, a gate electrode 14 is formed on the gate insulating film 12. The gate electrode 14 includes a layered structure of a semiconductor layer 14a formed of polycrystalline silicon (second semiconductor), and a metal semiconductor compound layer 14b formed of a reaction product of nickel and the polycrystalline silicon, that is, a nickel silicide (first metal semiconductor compound).

The impurity concentration of the polycrystalline silicon is desirably $1\times10^{19}$ cm$^{-3}$ or more. The impurity may be selected from n-type or p-type impurity elements in accordance with a threshold voltage required for the device. Hereinafter, an n-type will be exemplarily illustrated.

The thickness of the polycrystalline silicon semiconductor layer 14a is desirably 10 nm or more. If the thickness is thinner than 10 nm, a region where the nickel silicide is partially in contact with the gate insulating film 12 may occur because an interfacial roughness between the semiconductor layer 14a and the metal semiconductor compound layer 14b formed of the nickel silicide is approximately 10 nm, whereby a threshold voltage of the MOSFET may vary. Further, the thickness of the polycrystalline silicon is desirably 10 μm or less because of a processing constraint.

The thickness of the metal semiconductor compound layer 14b formed of the nickel silicide is, for example, approximately in the range of 5 to 200 nm. Ni/Si composition (atomic ratio) of the nickel silicide is desirably 0.5 and more and 2.0 or less. If the Ni/Si composition falls within the above-described range, the sheet resistance of the gate electrode required for a high-speed operation of the device can be realized.

Further, a cluster-state high carbon concentration region 14c is formed at the interface between the semiconductor layer 14a and the metal semiconductor compound layer 14b. Here, the "cluster-state high carbon concentration region" 14c means an aggregation in which carbon atoms are highly concentrated. "Cluster-state" can be rephrased as granular.

Figure 2A:
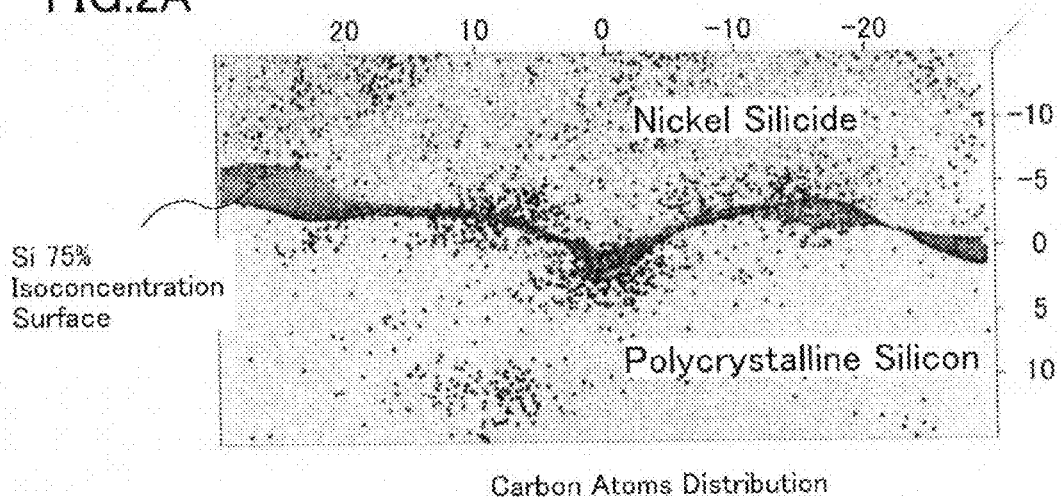
FIGS. 2A and 2B are an exemplary result of an atom probe analysis of a gate electrode portion of the semiconductor device according to the first embodiment.
Figure 2B:
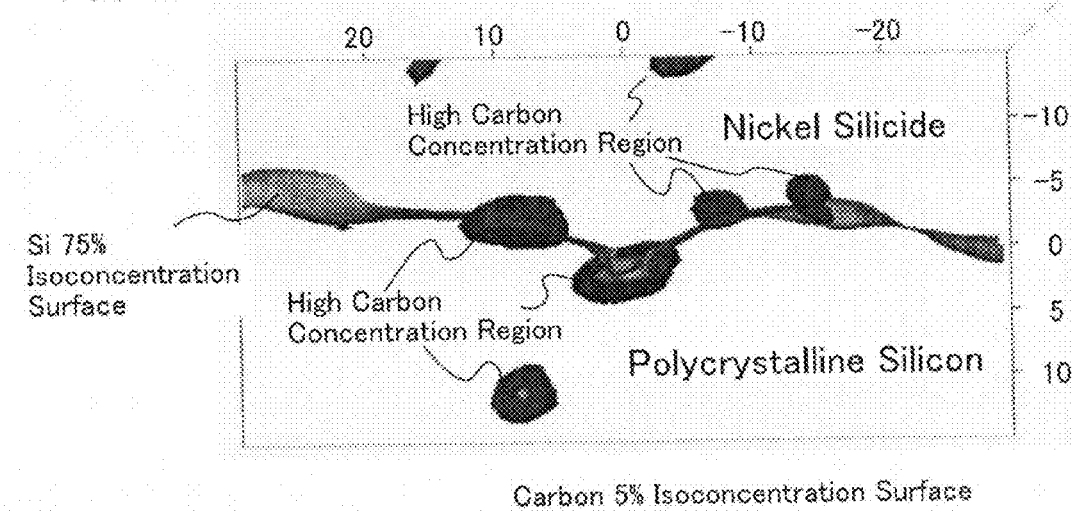

FIGS. 2A and 2B are an exemplary result of an atom probe analysis of a gate electrode portion of the semiconductor device according to the first embodiment. A structural analysis by an atom probe is performed by processing the gate electrode portion in a needle-shaped manner. FIG. 2A is a diagram showing a distribution of carbon atoms. FIG. 2B is a diagram showing a 5 atom % isoconcentration surface of the carbon atoms obtained by further performing image-processing of FIG. 2A. The unit of the figures is nm.

Further, a 75% isoconcentration surface of Si is shown both in FIGS. 2A and 2B. In the present specification, the interface between the semiconductor layer 14a and the metal semiconductor compound layer 14b is defined as the 75% isoconcentration surface of Si (second semiconductor) by the atom probe analysis.

Further, in the present specification, the high carbon concentration region 14c is defined as a region where the carbon atom concentration is 5 atom % or more.

As is clear from FIG. 2B, in the gate electrode 14 of the present embodiment, the cluster-state high carbon concentration region 14c is formed at the interface between the polycrystalline silicon semiconductor layer 14a and the metal semiconductor compound layer 14b made of a nickel silicide film.

In other words, two regions exist at the interface between the polycrystalline silicon semiconductor layer 14a and the metal semiconductor compound layer 14b made of the nickel silicide. One is a region where crystal grains of the polycrystalline silicon and crystal grains of the nickel silicide are joined, and the other is the high carbon concentration region 14c where the crystal grains of the polycrystalline silicon and the crystal grains of the nickel silicide are not directly joined.

Note that the high carbon concentration region 14c can exist in the polycrystalline silicon or in the nickel silicide as shown in FIG. 2B.

As described above, because of the existence of the high carbon concentration region 14c at the interface, a cause of reliability degradation such as the increase of the sheet resistance due to the aggregation of the nickel silicide film or the like can be suppressed even when the device is operated at a high temperature.

Further, a region having low contact resistance exists at the interface between the polycrystalline silicon and the nickel silicide, where the crystal grains of the polycrystalline silicon and the crystal grains of the nickel silicide are joined. Therefore, for example, sufficiently low interface resistance can be realized unlike a case where the high carbon concentration region exists at the interface in a layered manner.

An average of diameters of the high carbon concentration region 14c is desirably 1 nm or more and 30 nm or less, more desirably 2 nm or more and 15 nm or less. The diameter of the high carbon concentration region 14c is defined by the maximum diameter of the high carbon concentration region 14c. Further, a plurality of high carbon concentration regions 14c is randomly picked out, and the diameters are measured to obtain the average.

If the average falls below the above-described range, there is a concern that a sufficient aggregation inhibitory effect may not be obtained. Meanwhile, if the average exceeds the above-described range, there is a concern that the interface resistance may become too high.

Further, the surface density at the interface of the high carbon concentration region 14c is desirably $1 \times 10^{10}$ cm$^{-2}$ or more and $1 \times 10^{15}$ cm$^{-2}$ or less, more desirably $1 \times 10^{13}$ cm$^{-2}$ or more and $5 \times 10^{14}$ cm$^{-2}$ or less. If the surface density falls below the above-described range, there is a concern that the sufficient aggregation inhibitory effect cannot be obtained. Meanwhile, if the surface density exceeds the above-described range, there is a concern that the interface resistance may become too high. Note that the surface density at the interface of the high carbon concentration region 14c can be obtained from the result of the structural analysis by the atom probe.

Further, the surface density at the interface of the high carbon concentration region 14c is desirably larger than that of the crystal grains of the nickel silicide (first metal semiconductor compound). This is to obtain the sufficient aggregation inhibitory effect.

To suppress the aggregation of the nickel silicide film, it is effective to cause the high carbon concentration region 14c to exist in a grain boundary region of the nickel silicide crystal grains having especially-large interfacial energy, or in a triple point where three crystal grains come in contact each other.

The thickness of the gate electrode 14 is, for example, 50 nm to 10 μm. A side wall insulating film 16 made of a silicon oxide film is formed at both side walls of the gate electrode 14. Further, an interlayer insulating film 18 formed of a silicon oxide film is formed on the gate electrode 14.

A p-type SiC region 20 having a 4H-SiC structure is formed in the n⁻-type SiC layer 10b. The p-type SiC region 20 functions as a channel region or a well region of the DIMOSFET 100. The impurity concentration of the p-type SiC region 20 is, for example, approximately, $5 \times 10^{16}$ to $2 \times 10^{16}$ cm$^{-3}$. The junction depth of the p-type SiC region 20 is approximately 0.1 to 1.5 μm.

Further, an n⁺-type SiC region 22 having the 4H-SiC structure is formed in the n⁻-type SiC layer 10b so as to be surrounded by the p-type SiC region 20. The n⁺-type SiC region 22 functions as a source region of the DIMOSFET 100. The n⁺-type SiC region 22 is a single crystal.

The junction depth of the n⁺-type SiC region 22 is in the range of 0.05 to 1 μm, and is shallower than that of the p-type SiC region 20. The impurity of the n⁺-type SiC region 22 is, for example, either nitrogen (N) or phosphorus (P), or both of them, and the impurity concentration is desirably approximately $5 \times 10^{19}$ to $3 \times 10^{21}$ cm$^{-3}$, for example.

Further, a p⁺-type SiC region 24 having the 4H-SiC structure is formed in the n⁻-type SiC layer 10b. The p⁺-type SiC region 24 is surrounded by the p-type SiC region 20, is connected to the p-type SiC region 20, and is in contact with the n⁺-type SiC region 22. The p⁺-type SiC region 24 functions as a well connection region of the DIMOSFET 100. The p⁺-type SiC region 24 is a single crystal.

The depth of the p⁺-type SiC region 24 is in the range of 0.05 to 1 μm, and is shallower than that of the p-type SiC region 20. Further, the impurity of the p⁺-type SiC region 24 is either boron (B) or aluminum (Al), or both of them. The impurity concentration is desirably approximately $1 \times 10^{19}$ to $3 \times 10^{21}$ cm$^{-3}$.

Source electrodes 26 are formed on the SiC substrate 10 to interpose the gate electrode 14 therebetween. The source electrode 26 is formed of a nickel silicide (second metal semiconductor compound) that is a reaction product of nickel and the single-crystal hexagonal 4H-SiC (first semiconductor). The source electrode 26 is, more specifically, formed on the n$^+$-type SiC region 22 and the p$^+$-type SiC region 24. The source electrode 26 also functions as a well electrode that applies a potential to the p-type SiC region 20.

The thickness of the source electrode 26 formed of the nickel silicide is, for example, approximately in the range of 5 to 200 nm. The thickness of the source electrode 26 is desirably shallower than the junction depth of the n$^+$-type SiC region 22.

If the nickel silicide is thicker and the n$^+$-type SiC region 22 is thinner, the sheet resistance of the n$^+$-type SiC region 22 immediately under the nickel silicide increases, whereby device properties may be deteriorated. Meanwhile, in a case where the nickel silicide is thin, there is a concern that thermal stability is deteriorated and a uniform film structure cannot be stably formed.

Therefore, the thickness of the nickel silicide is desirably secured to be 10 nm or more, more desirably 20 nm or more. If the thickness falls below the above-described thickness, the aggregation of the nickel silicide film may occur when a thermal process of 600° C. or more is applied to the thermal process of the silicide during manufacturing, whereby deterioration of the device properties due to deterioration of a device yield and the increase of the sheet resistance may occur.

High-concentration carbons (C) derived from the SiC substrate 10 are contained in the nickel silicide, and the carbon composition on an outermost surface is desirably 20 atom % or less. Accordingly, the adhesiveness between the nickel silicide film and a metal wiring such as an aluminum (Al) wiring formed at an upper part is secured, and excellent device properties are secured during post processes and during the device operation at a high temperature without occurring film peeling. As a means to realize the above, a carbon (C) absorber layer such as titanium (Ti) may be layered at the formation of the nickel silicide. Alternatively, a carbon layer precipitated on the surface may be physically removed by a method such as argon etching.

A first metal electrode 28 is formed on the interlayer insulating film 18. The first metal electrode 28 is formed on the source electrode 26 and the source electrode 26 and the first metal electrode 28 are connected through a contact hole part (opening) provided at the interlayer insulating film 18. The first metal electrode 28 is, for example, aluminum (Al). The first metal electrode 28 functions as a source electrode and a well electrode of the DIMOSFET 100.

A titanium (Ti) layer or a titanium nitride (TiN) layer may be interposed at the interface between the first metal electrode 28 and the source electrode 26. With such a structure, more excellent adhesiveness at the interface can be realized.

Further, a thin film having thermally-stable metallic properties such as a titanium nitride (TiN) layer or a tantalum carbide (TaC) layer may be interposed at the interface between the first metal electrode 28 made of aluminum (Al), and the side wall insulating film 16 or the interlayer insulating film 18. With such a structure, a diffusion phenomenon of aluminum (Al) toward the side wall insulating film 16 or the interlayer insulating film 18 can be suppressed, and reliability during the device operation at a high temperature can be improved. Typically, the above-described thin film may be a metal or an intermetallic compound having metallic properties to serve as a diffusion barrier of Al or Cu. The film thickness may be secured in such a way that the diffusion of the metal such as aluminum from the first metal electrode 28 can be sufficiently suppressed in view of the device temperature during a thermal process of a post process in the device manufacturing or during an actual operation of the device.

Further, a structure may be employed in which a silicon nitride film (hereinafter, also represented as SiN) is arranged so as to cover the side wall insulating film 16 or the interlayer insulating film 18. SiN has hydrogen fluoride resistant compared with SiO$_2$, and can suppress deviation from a designed value of the area of a silicide or the like at a dilute hydrofluoric acid process that is performed as a pretreatment of a Ni sputtering process during the manufacturing process.

Further, the dilute hydrofluoric acid process is a necessary process in order to remove an oxide film formed on a surface of the nickel silicide during the formation of an aluminum film of the first metal electrode 28, and in this case, there is a concern that the contact hole may extend over a region where a silicide is not formed. The above-described structure is effective as a mean to solve this problem.

To cause to appear these effects, the film thickness of the SiN is favorably 5 nm or more, and the maximum film thickness may just fall within a range that is sufficiently small enough with respect to the area of the contact hole, so that the device properties may not be affected. Further, from a viewpoint of easiness in the manufacturing method, the film thickness is favorably 50 nm or less.

A second metal electrode 30 made of a layered film of a nickel silicide and titanium is formed on the n$^+$-type SiC layer 10a, that is, on a back surface of the SiC substrate 10, for example. The second metal electrode 30 functions as a drain electrode.

As described above, the silicon oxide film is taken as an example and illustrated as the gate insulating film 12. However, an example of the material for the gate insulating film other than the silicon oxide film includes high dielectric such as Si$_3$N$_4$, Al$_2$O$_3$, Ta$_2$O$_5$, TiO$_2$, La$_2$O$_5$, CeO$_2$, ZrO$_2$, HfO$_2$, SrTiO$_3$, or Pr$_2$O$_3$. Alternatively, a material that is a combination of the high dielectric materials such as LaAl oxide may be employed. In addition, silicate that is a material of a mixture of silicon oxide and metal ions may also be employed.

Further, a threshold voltage adjustment may be performed by layering the silicon oxide film and the high dielectric film, and forming and using fixed charges and interface dipoles formed in the film or at the interface. Further, it is effective to introduce nitrogen or hydrogen into the gate insulating film or to the interface for reduction of the fixed charges and the interfacial trap density in the gate insulating film and at the interface thereof, which may be a cause to deteriorate the device properties. For example, in the introduction of nitride, a proper concentration may be introduced into a necessary position by a method with NH$_3$, NO$_2$ gas, or nitrogen turned into plasma in accordance with the gate insulating film properties or the film thickness required for the device.

The material for the gate insulating film may be properly selected from the materials having the heat-resistance required for each generation transistor and a manufacturing process thereof.

As described above, nickel (Ni) is taken as an example and illustrated as the metal used for forming the metal semiconductor compound of the source electrode 26 and the drain electrode 30. However, the metal used for forming the metal silicide is not limited to nickel. A metal that forms a silicide by a solid-phase reaction with SiC with a heat treatment can be properly used depending on the form of the device.

For example, an alloy or a layered structure with a metal that preferentially reacts with carbon (C) during a reaction with SiC such as Ni/Ti, a Ni—Ti alloy, or the like may be used.

Further, the reaction between SiC and the metal has a higher reaction temperature than the reaction between silicon (Si) and the metal, and therefore, there is a case that the device properties of the device manufactured by this heat treatment may be deteriorated. In this case, Si or Ge may be included in the metal that forms the silicide so that the reaction temperature can be lowered. Also, the composition ratio between the metal that forms the silicide and Si or Ge may be adjusted by controlling the temperature or the time of the heat treatment in accordance with a work function of the electrode required for the device. Examples of the metal other than Ni used for forming the metal silicide include Pd, Pt, Co, Ta, Hf, and Zr.

Figure 3:
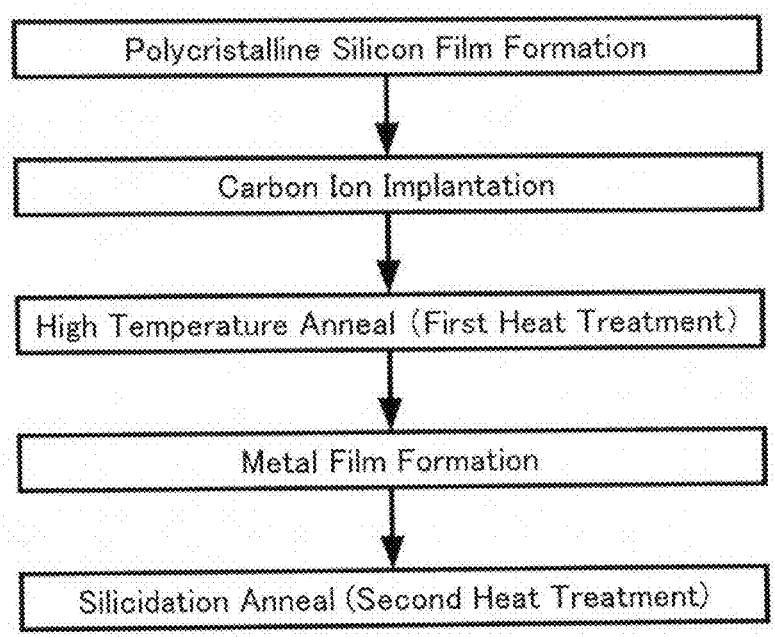
FIG. 3 is a process flow diagram of a substantial part of a manufacturing method according to the first embodiment.

Next, a method of manufacturing the DIMOSFET 100 of the present embodiment shown in FIG. 1 will be described. FIG. 3 is a process flow diagram of a substantial part of a manufacturing method according to the present embodiment. Also, FIGS. 4 to 11 are schematic process sectional views showing a method of manufacturing the semiconductor device according to the present embodiment.

As shown in FIG. 3, a method of manufacturing a semiconductor device of the present embodiment includes, for example, performing carbon ion implantation to a semiconductor film of a polycrystalline silicon film, performing high-temperature anneal (first heat treatment) to cluster the carbons in the polycrystalline silicon film, forming a metal film on the polycrystalline silicon film, performing silicidation anneal (second heat treatment) to cause a reaction between the polycrystalline silicon and the metal film to form a metal silicide film (metal semiconductor compound film).

First, the single-crystal SiC substrate 10 is prepared, which includes the $n^+$-type SiC layer 10a having the 4H-SiC structure and the $n^-$-type SiC layer 10b having the 4H-SiC structure and having a lower n-type impurity concentration than $n^+$-type SiC layer 10a.

The thickness of the $n^-$-type SiC layer 10b is, for example, 10 μm, and is formed by epitaxial growth on the $n^+$-type SiC layer 10a.

Next, the p-type impurity region 20 having the 4H-SiC structure is formed in the $n^-$-type SiC layer 10b, for example, by Al ion implantation and a heat treatment for activation. Further, the $n^+$-type SiC region 22 having the 4H-SiC structure is formed in the $n^-$-type SiC layer 10b, for example, by P ion implantation and a heat treatment (anneal) for activation.

Next, the $p^+$-type SiC region 24 having the 4H-SiC structure is formed in the $n^-$-type SiC layer 10b. The $p^+$-type SiC region 24 is connected to the p-type SiC region 20, is shallower than the p-type SiC region 20 in depth, and is higher than the p-type SiC region 20 in p-type impurity concentration. The $p^+$-type SiC region 24 is, for example, formed by Al ion implantation and a heat treatment (anneal) for activation.

In the ion implantation for forming the p-type impurity region 20 having the 4H-SiC structure, the $n^+$-type SiC region 22 having the 4H-SiC structure, and the $p^+$-type SiC region 24, it is effective to cause a substrate temperature to be high during the ion implantation, and the range of the substrate temperature is desirably 400 to 650° C. in order to suppress deterioration of SiC crystallinity due to a physical damage during the ion implantation.

Next, a gate insulating film 12 made of a silicon oxide film is formed by a known method, the film covering surfaces of the $n^-$-type SiC layer 10b, the p-type SiC region 20, and the $n^+$-type SiC region 22, for example. Further, the semiconductor layer 14a made of the $n^+$-type polycrystalline silicon film is formed on the gate insulating film 12. As the $n^+$-type polycrystalline silicon film, a polycrystalline silicon film including an n-type impurity is formed by a chemical vapor deposition (CVD) method, for example. Alternatively, the $n^+$-type polycrystalline silicon film can be formed by implanting the n-type impurity by the ion implantation into a non-doped polycrystalline silicon film formed by the CVD method.

Figure 4:
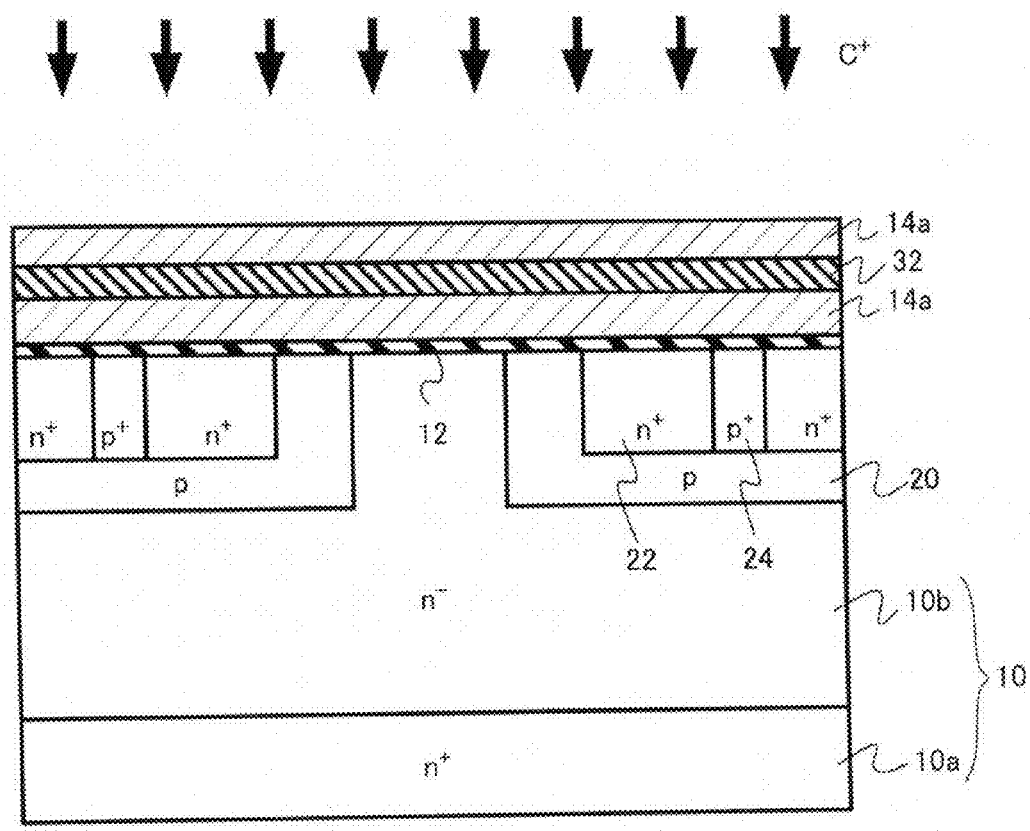
FIG. 4 is a schematic process sectional view showing a method of manufacturing the semiconductor device according to the first embodiment.

Then, a carbon injection layer 32 where highly-concentrated carbons are distributed is formed by performing carbon ion (C+) ion implantation into the semiconductor layer 14a made of the $n^+$-type polycrystalline silicon film (FIG. 4). The implantation energy and the dose amount of the carbon ion implantation may be adjusted in accordance with an objective depth at which the high carbon concentration region 14c (FIG. 1) is distributed.

At this time, the film thickness of the nickel silicide of a final structure is defined by a depth region where the high carbon concentration region 14c is distributed. Therefore, it is necessary to determine the implantation energy of the carbon ions in view of an objective thickness of the nickel silicide. The dose of the carbon ion implantation is desirably 1e13 $cm^{-2}$ or more and 5e16 $cm^{-2}$ or less.

Figure 5:
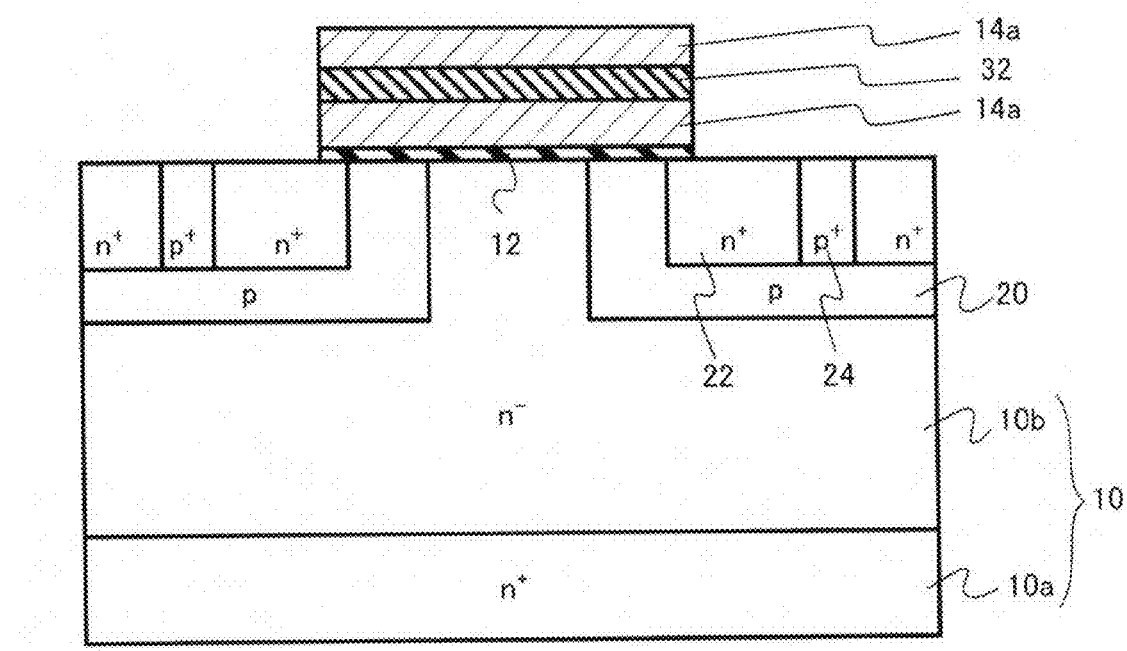
FIG. 5 is a schematic process sectional view showing the method of manufacturing the semiconductor device according to the first embodiment.

Next, the semiconductor layer 14a made of the $n^+$-type polycrystalline silicon film is patterned by lithography, anisotropic etching, or isotropic etching (FIG. 5).

Figure 6:
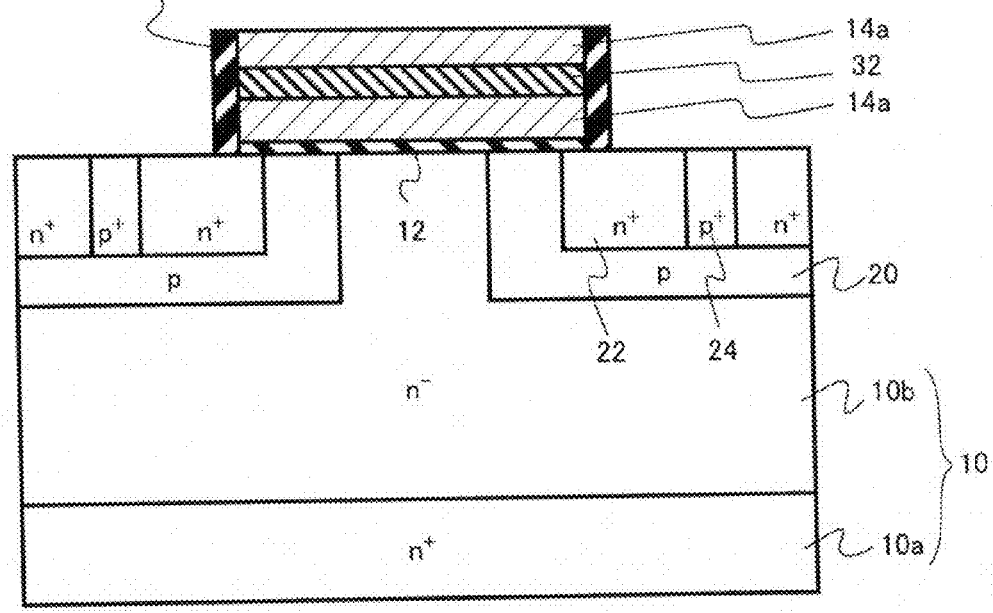
FIG. 6 is a schematic process sectional view showing the method of manufacturing the semiconductor device according to the first embodiment.

Then, the side wall insulating film 16 made of a silicon oxide film for separating the gate electrode and the source electrode are formed, for example (FIG. 6). The side wall insulating film 16 may be formed by the CVD such as TEOS, for example, or may be patterned using the lithography so as to be formed only at a side of a gate structure. Alternatively, the side wall insulating film 16 may be remained only at the side of the gate structure in a self-aligning manner using a side wall process.

Figure 7:
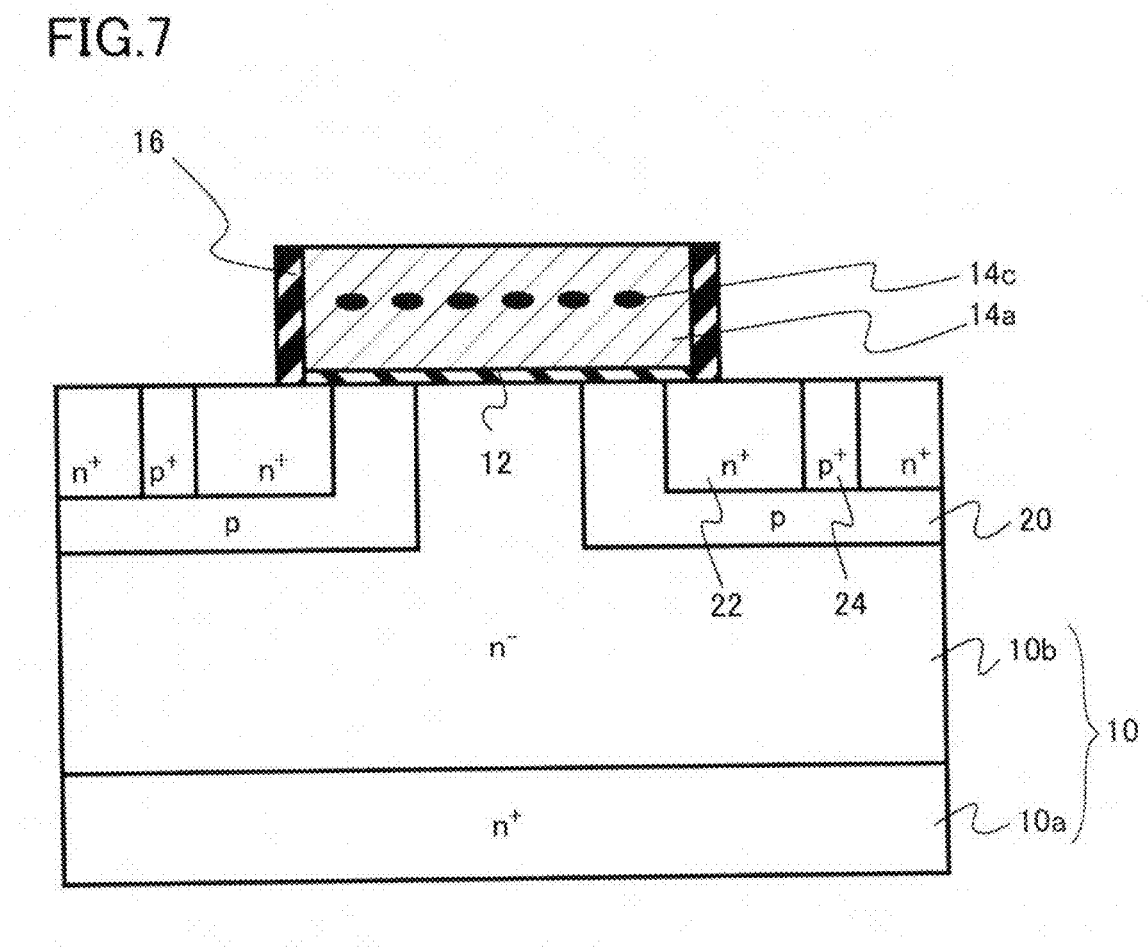
FIG. 7 is a schematic process sectional view showing the method of manufacturing the semiconductor device according to the first embodiment.

Next, after the formation of the side wall insulating film 16, the carbons in the carbon injection layer 32 in the semiconductor layer 14a made of the $n^+$-type polycrystalline silicon film are clustered by applying high-temperature anneal (first heat treatment). Then, the cluster-state or granular high carbon concentration region 14c is formed at a position of the objective depth (FIG. 7).

Note that the high-temperature anneal (first heat treatment) can be performed immediately after the carbon ion implantation. The objective of the high-temperature anneal is to cluster the ion-implanted carbons, and the high-temperature anneal is performed at any time between after the carbon ion implantation and before the silicidation annealing (second heat treatment) for forming the nickel silicide film (first metal silicide film). Further, the high-temperature anneal facilitates the activation of the impurity in the polycrystalline silicon.

Figure 8:
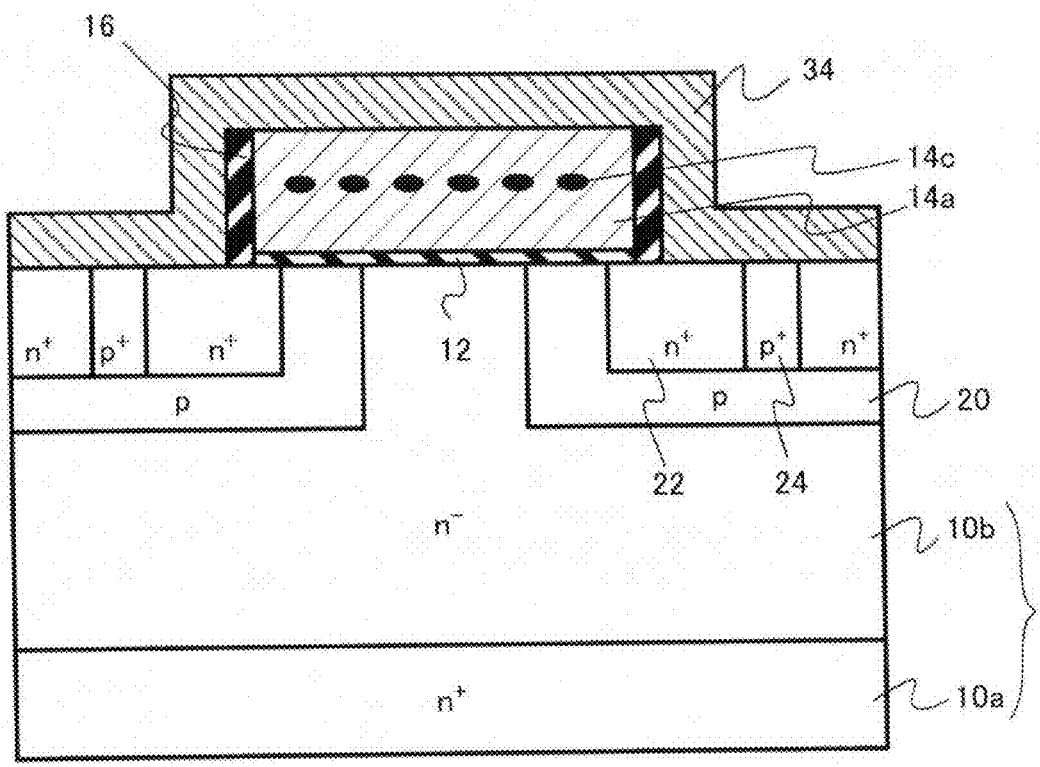
FIG. 8 is a schematic process sectional view showing the method of manufacturing the semiconductor device according to the first embodiment.

Next, a metal film 34 made of nickel is formed on the semiconductor layer 14a made of the polycrystalline silicon film and on the n-type SiC substrate 10, for example (FIG. 8).

Figure 9:
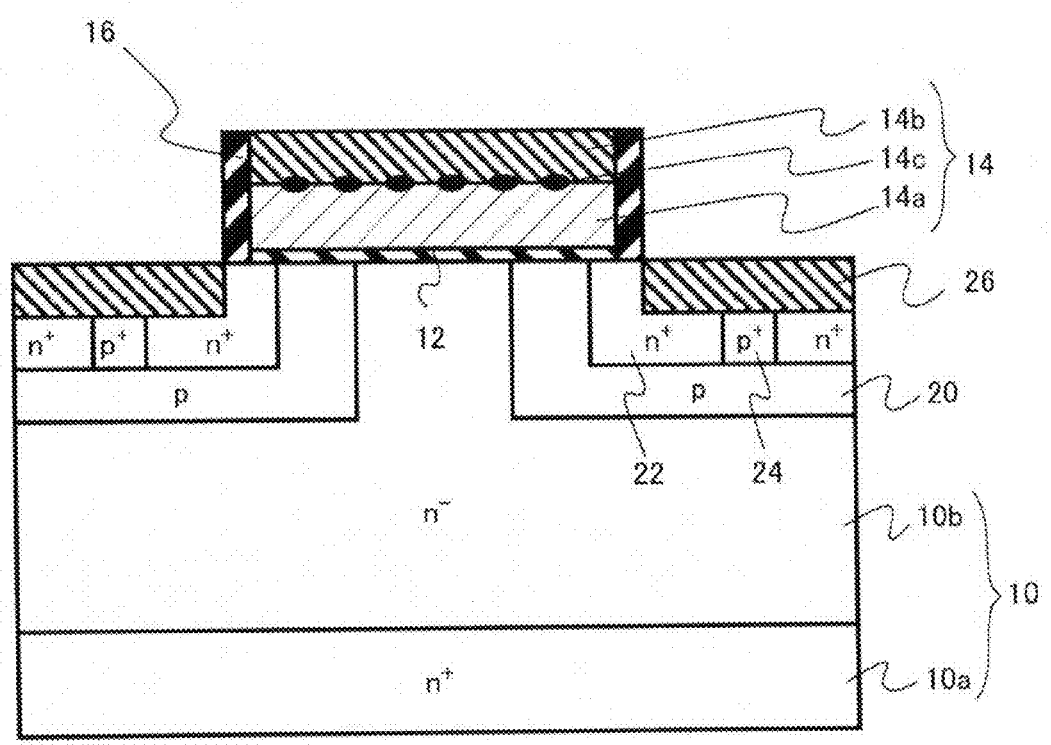
FIG. 9 is a schematic process sectional view showing the method of manufacturing the semiconductor device according to the first embodiment.

Then, the silicidation anneal (second heat treatment) is performed to cause the reaction between the semiconductor layer 14a made of the polycrystalline silicon film and the nickel metal film 34 to form the metal semiconductor compound layer (first metal silicide film) 14b formed of the nickel silicide. Further, at the same time, the n-type SiC substrate 10 and the nickel metal film 34 are caused to react to form the source electrode (second metal silicide film) 26 made of the nickel silicide. Then, unreacted nickel on the side wall insulating film 16 or the like is removed by acid solution containing sulfuric acid or the like (FIG. 9).

When the silicidation anneal is performed by a high-temperature heat treatment at approximately 800° C., there is a concern of occurring the aggregation of the nickel film on the side wall insulating film 16 in a case where the side wall insulating film 16 is made of a silicon oxide film. To avoid the aggregation, the heat treatment for the formation of the nickel silicide is divided into two steps, and the above-described acid process is performed between the two steps, whereby the aggregation of the nickel film can be suppressed, and uniformity of the formed nickel silicide film can be improved.

The temperature of the silicidation anneal is desirably in the range of 500° C. or more and 1000° C. or less. In a case where the temperature is lower than the above range, the silicidation reaction of the source electrode 26 may not sufficiently progress, whilst in a case of a high temperature, the objective gate sheet resistance may be realized due to the aggregation of the silicide of the gate electrode 14. To sufficiently reduce the contact resistance at the interface of the source electrode 26, it is desirably 700° C. or more.

Figure 12:
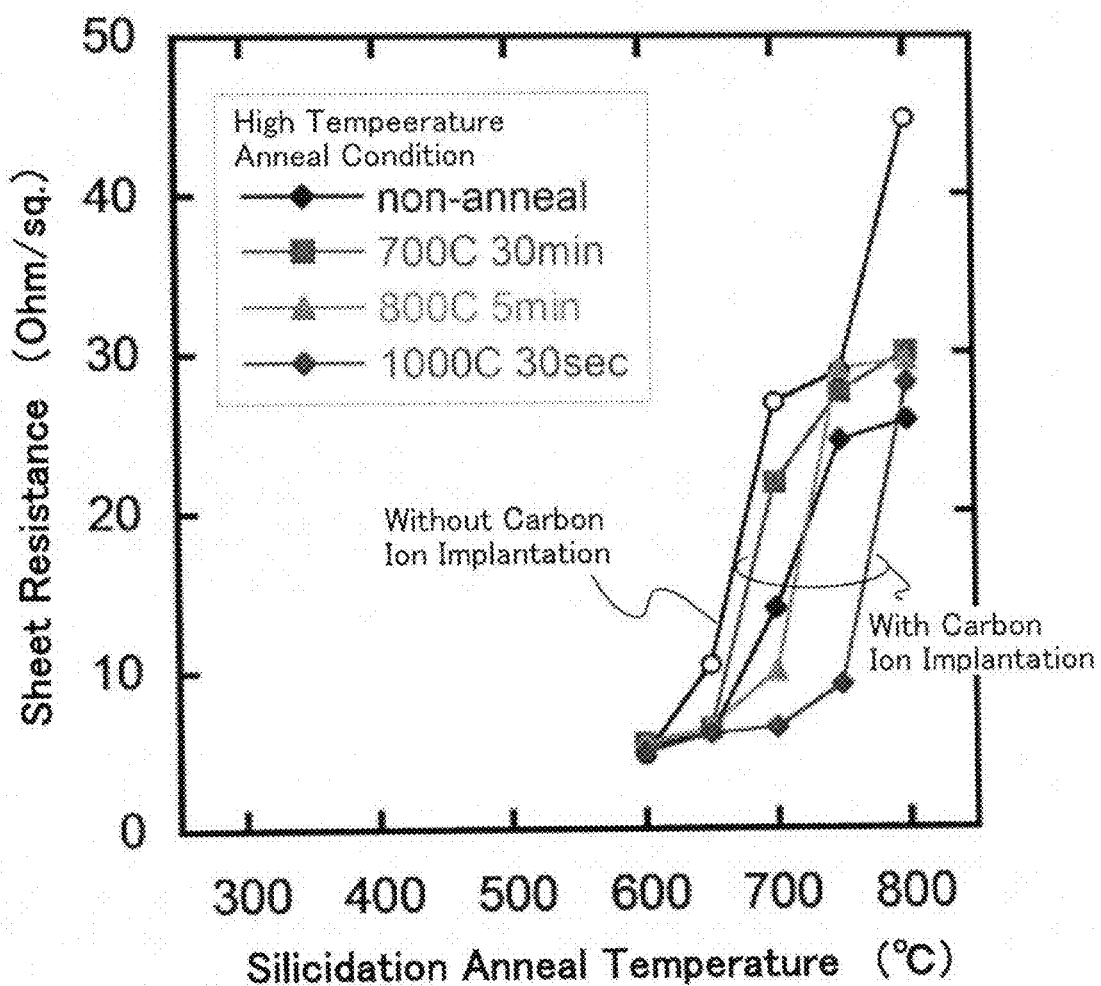
FIG. 12 is a diagram showing an effect of carbon ion implantation and high-temperature anneal according to the first embodiment.

FIG. 12 is a diagram showing an effect of the carbon ion implantation and the high-temperature anneal. The carbon ion implantation into the polycrystalline silicon film is performed, and the high-temperature anneal (first heat treatment) is carried out under different conditions. Then, nickel is deposited by 30 nm, and the silicidation anneal (second heat treatment) is carried out under different temperatures, and the sheet resistance values are evaluated.

For comparison, a sample without the carbon ion implantation ("control" in the drawing) is also evaluated. As is clear from FIG. 12, low sheet resistance values can be maintained in the high-temperature silicidation anneal because of the high-temperature anneal after the carbon ion implantation.

The high-temperature anneal (first heat treatment) is favorably 700° C. or more and 1200° C. or less. It is because, if the temperature falls below the range, a sufficient aggregation inhibitory effect of the metal semiconductor compound layer 14b of the gate electrode 14 may not be obtained, whilst, if the temperature exceeds the range, the formation of the cluster-state high carbon concentration region 14c may not performed. Especially, from a viewpoint of suppressing the aggregation, the temperature is desirably 800° C. or more, more desirably 1000° C. or more.

FIGS. 13A and 13B are SEM photographs of sections of the gate electrode structure after the silicidation anneal. FIG. 13A shows a case without the carbon ion implantation, and FIG. 13B shows a case where the carbon ion implantation and the high-temperature anneal are performed. The silicidation anneal is performed at 750° C.

In the case without the carbon ion implantation, the aggregation of the nickel silicide occurs, and the layered structure of the nickel silicide and the polycrystalline silicon cannot be maintained. Meanwhile, it can be confirmed that, in the case where the carbon ion implantation and the high-temperature anneal are performed, the structure in which a layered nickel silicide film is uniformly formed can be maintained.

In a case where the silicidation reaction on the SiC substrate 10 does not sufficiently progress, it is effective to use a method in conjunction with the silicidation anneal, where a dopant or the ion implantation of an inert element is performed immediately before the formation of the nickel film, and the crystal structure of the SiC substrate 10 is physically destroyed to lower the reaction temperature of the nickel silicide.

Figure 10:
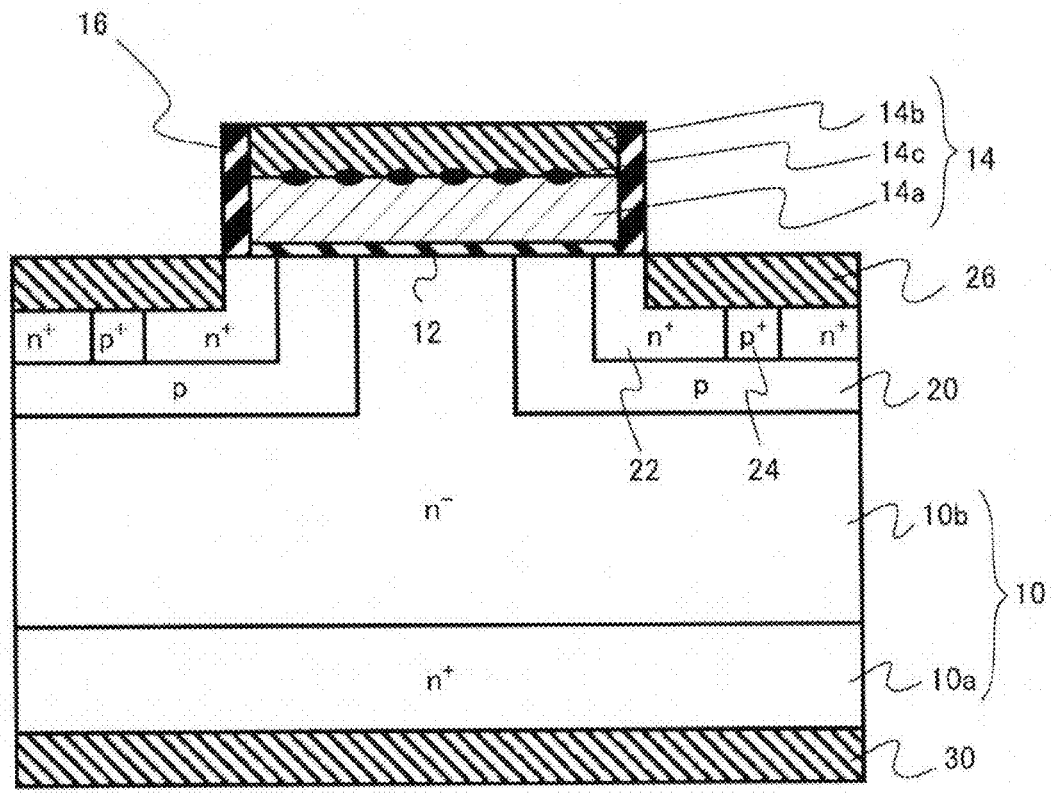
FIG. 10 is a schematic process sectional view showing the method of manufacturing the semiconductor device according to the first embodiment.

Next, the second metal electrode 30 as a drain electrode is formed on the n$^+$-type SiC layer 10a, that is, on the back surface of the SiC substrate 10 (FIG. 10). In the present embodiment, for example, a layered film of the nickel silicide and titanium is used.

The thickness of the nickel film is desirably 100 nm or more in order to suppress carbons precipitated on a surface of the silicide. The thickness of the titanium film may be selected from the thickness by which the carbons precipitated on the surface can be sufficiently suppressed.

A method of forming the silicide on the back surface is performed under a condition where the interface properties exhibit ohmic resistance. Although the heat treatment at 700° C. or more is typically favorable, the condition is not limited to the above-described condition. In a case where a metal species that exhibits the ohmic properties at a low temperature is used, or in a case where a technology of low-temperature ohmic electrode such as an impurity segregation technology is used, an optimum condition of the heat treatment may be employed in accordance with the properties of each electrode material.

Further, in a case where it is better to form an electrode on the back surface of the substrate before the silicide is formed on the source region of the surface of the substrate, the order of the processes may be interchanged in view of the process temperature or the like. Especially, in a case where the heat treatment at 800° C. or more is required for forming an electrode on the back surface, the process of forming the silicide on the back surface is performed first, and then the process of forming the silicide on the surface is performed, so that the aggregation of the silicide on the gate electrode can be suppressed.

Figure 11:
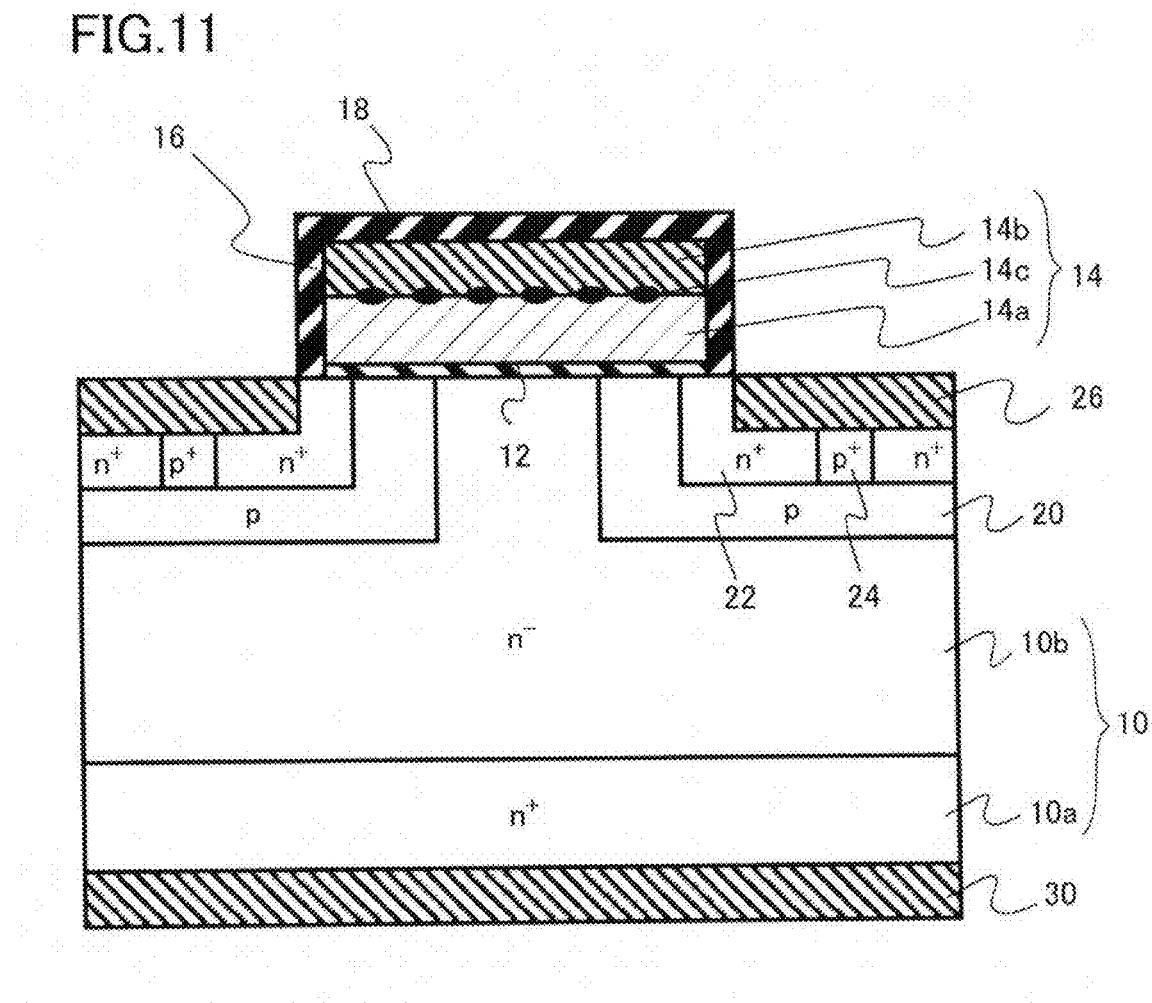
FIG. 11 is a schematic process sectional view showing the method of manufacturing the semiconductor device according to the first embodiment.

Next, the interlayer insulating film 18 made of a silicon oxide film is formed on the gate electrode 14, for example (FIG. 11). Then, the contact hole is formed in a pad region of the source electrode 26 and the gate electrode 14 by a lithography method. Then, for example, a film of aluminum (Al) is formed, and the aluminum (Al) is maintained only on an electrode portion by photoresist to form the first metal electrode 28.

According to the above-described manufacturing process, the DIMOSFET 100 shown in FIG. 1 is manufactured.

As described above, it is necessary that the silicidation anneal for the formation of the nickel silicide on the single-crystal SiC substrate be performed at a higher temperature than the silicidation anneal for the formation of the nickel silicide on the polycrystalline silicon. Further, if the temperature for the silicidation anneal for the formation of the nickel silicide on the polycrystalline silicon is made high enough that is required for the silicidation anneal for the formation of the nickel silicide on the single-crystal SiC substrate, the aggregation of the nickel silicide film occurs. Therefore, it is typically difficult to form the nickel silicide by the same process on the gate electrode having a polycrystalline silicon base and on the source electrode having a single-crystal SiC base.

According to the manufacturing method of the present embodiment, the aggregation of the nickel silicide film can be suppressed during the silicidation anneal by performing the carbon ion implantation and the high-temperature anneal in the formation of the nickel silicide of the gate electrode. Therefore, the silicidation of the gate electrode and the source electrode can be realized by the same process, whereby the manufacturing process of the DIMOSFET can be simplified. Further, according to the manufacturing method of the present embodiment, a semiconductor device that realizes a high-speed operation and high reliability can be manufactured by providing the gate electrode having low resistance and high heat-resistance.

Second Embodiment

The present embodiment differs from the first embodiment in the point that a semiconductor device is an insulated gate bipolar transistor (IGBT). A structure of a gate electrode and substantial parts of a manufacturing method are similar to the first embodiment. Therefore, description of the contents that overlap with the first embodiment is omitted.

Figure 14:
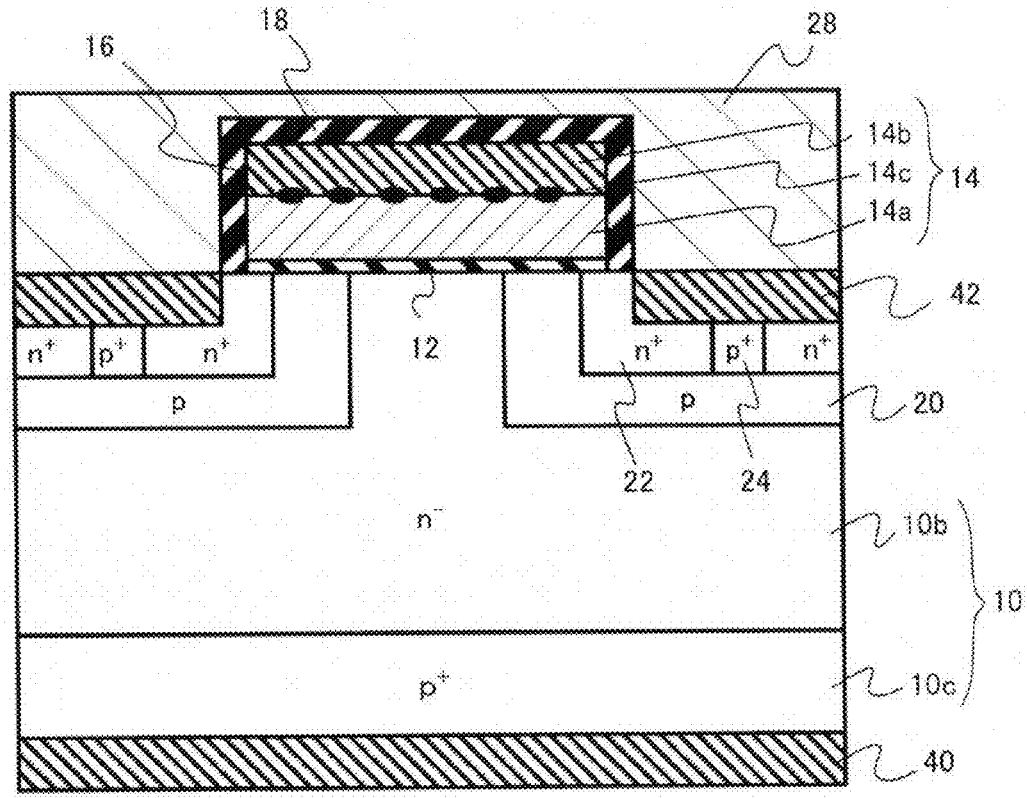
FIG. 14 is a schematic sectional view of a semiconductor device according to a second embodiment.

FIG. 14 is a schematic sectional view of a semiconductor device according to the present embodiment.

An IGBT 200 uses a single-crystal 4H-SiC SiC substrate 10 including a p$^+$-type SiC layer 10c and an n$^-$-type SiC layer 10b. The p$^+$-type SiC layer 10c includes, for example, aluminum (Al) as a p-type impurity having the impurity concentration of approximately $5 \times 10^{18}$ to $1 \times 10^{19}$ cm$^{-3}$.

The p$^+$-type SiC layer 10c functions as a collector region of the IGBT 200. A nickel silicide film is formed on the p$^+$-type SiC layer 10c, that is, on a back surface of the SiC substrate 10 as a collector electrode 40. Further, the nickel silicide film on the n$^-$-type SiC layer 10b is an emitter electrode 42 of the IGBT 200. The emitter electrode 42 also functions as a well electrode. Other structures are similar to the first embodiment. Also, the manufacturing method is basically the same as the first embodiment except that the SiC substrate is different.

As described above, according to the IGBT of the present embodiment, a high-speed operation and high reliability can be realized by providing the gate electrode having low resistance and high heat-resistance. Further, according to the method of manufacturing the IGBT of the present embodiment, the method of manufacturing the IGBT can be simplified.

Third Embodiment

The present embodiment is similar to the first embodiment except that a semiconductor layer 14a that is a lower layer of a gate electrode 14 is a polycrystalline p$^+$-type silicon germanide (p$^+$-type polycrystalline silicon Ge) and a metal semiconductor compound layer 14b is a nickel silicon germanide. Therefore, description of the contents that overlap with the first embodiment is omitted.

Figure 15:
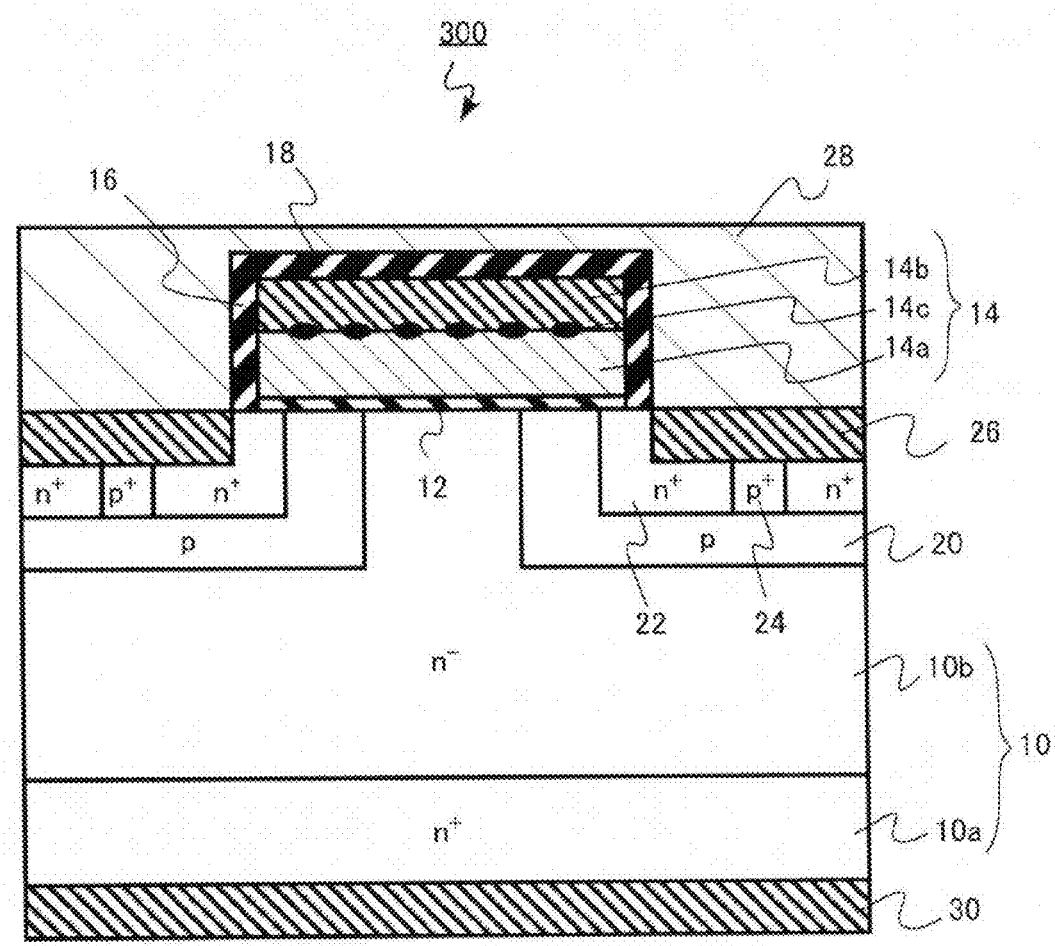
FIG. 15 is a schematic sectional view of a semiconductor device according to a third embodiment.

FIG. 15 is a schematic sectional view of a semiconductor device according to the present embodiment.

A DIMOSFET 300 includes the semiconductor layer 14a that is a lower layer of the gate electrode 14 and is made of the polycrystalline p$^+$-type silicon germanide (p$^+$-type polycrystalline silicon Ge), and the metal semiconductor compound layer 14b made of the nickel silicon germanide.

The aggregation temperature of the nickel silicon germanide on the p$^+$-type polycrystalline silicon Ge is lower than that of the nickel silicide on the single-crystal SiC.

According to the DIMOSFET 300 of the present embodiment, a high-speed operation and high reliability can be realized, as similar to the first embodiment, by providing the gate electrode having low resistance and high heat-resistance. Further, according to the method of manufacturing the DIMOSFET of the present embodiment, the method of manufacturing the DIMOSFET can be simplified.

Further, the DIMOSFET can be realized where a threshold voltage of the gate electrode 14 can be controlled by a value between the case of using the n$^+$-type polycrystalline silicon as the semiconductor layer 14a and the case of using the p$^+$-type polycrystalline silicon as the semiconductor layer 14a. A valence band edge of the p$^+$-type polycrystalline silicon is controllable by a value between silicon (Si) and germanium (Ge) in accordance with a germanium (Ge) composition, and the threshold voltage up to 0.6 V can be controlled.

Fourth Embodiment

In the present embodiment, a semiconductor device is a NAND-type flash memory. A structure and substantial parts of a manufacturing method are similar to the first embodiment. Therefore, description of the contents that overlap with the first embodiment is omitted.

Figure 16:
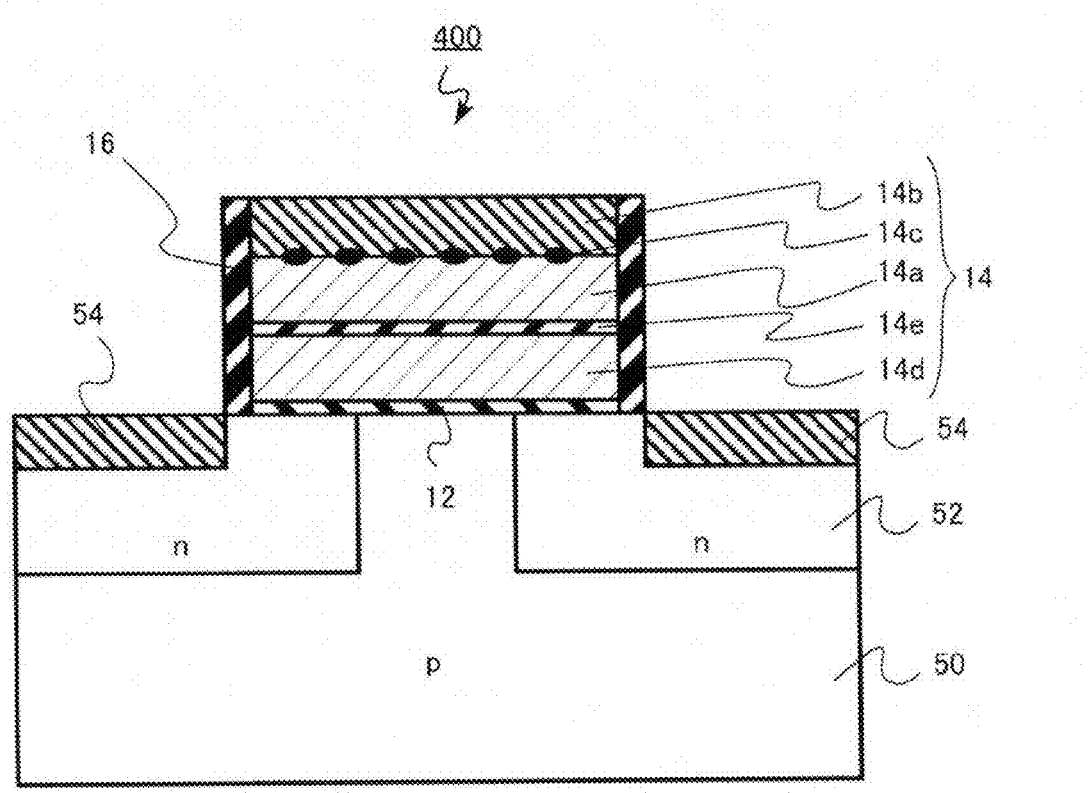
FIG. 16 is a schematic sectional view of a semiconductor device according to a fourth embodiment.

FIG. 16 is a schematic sectional view of a semiconductor device according to the present embodiment. FIG. 16 shows a cross-section of a memory cell transistor of a NAND-type flash memory 400.

A source/drain region 52 made of an n$^+$ diffusion layer is formed on a surface of a single-crystal p-type Si substrate (first semiconductor) 50. A nickel silicide that serves as a source/drain electrode 54 is formed on the source/drain region 52.

A gate electrode 14 is formed on a tunnel film (gate insulating film) 12 on the substrate 50 so as to be positioned between the source/drain electrodes 54. The gate electrode 14 includes a layered structure of a polycrystalline silicon charge trap layer 14d, an interpoly insulating film layer 14e, a p$^+$-type polycrystalline silicon semiconductor layer 14a, and a metal semiconductor compound layer 14b made of a nickel silicide (first metal semiconductor compound).

The semiconductor layer 14a and the metal semiconductor compound layer 14b function as a control gate electrode. Further, a cluster-state high carbon concentration region 14c is formed at the interface between the semiconductor layer 14a and the metal semiconductor compound layer 14b.

The aggregation temperature of the nickel silicide on the polycrystalline silicon is lower than that of the nickel silicide on the single-crystal Si.

According to the NAND-type flash memory of the present embodiment, a high-speed operation and high reliability can be realized, as similar to the first embodiment, by providing the gate electrode having low resistance and high heat-resistance. Also, according to the method of manufacturing the NAND-type flash memory of the present embodiment, the method for manufacturing the NAND-type flash memory can be simplified.

Further, for example, a heat treatment at 650° C. or more can be performed after the process of forming the silicide of the gate electrode, whereby process freedom can be improved. Therefore, higher efficiency and higher reliability of the NAND-type flash memory can be realized.

Fifth Embodiment

The present embodiment is similar to the fourth embodiment except that a semiconductor layer 14a of a gate electrode 14 is made of polycrystalline p$^+$-type germanium (Ge), and the metal semiconductor compound layer 14b is made of a nickel germanide. Therefore, description of the contents that overlap with the fourth embodiment is omitted.

Figure 17:
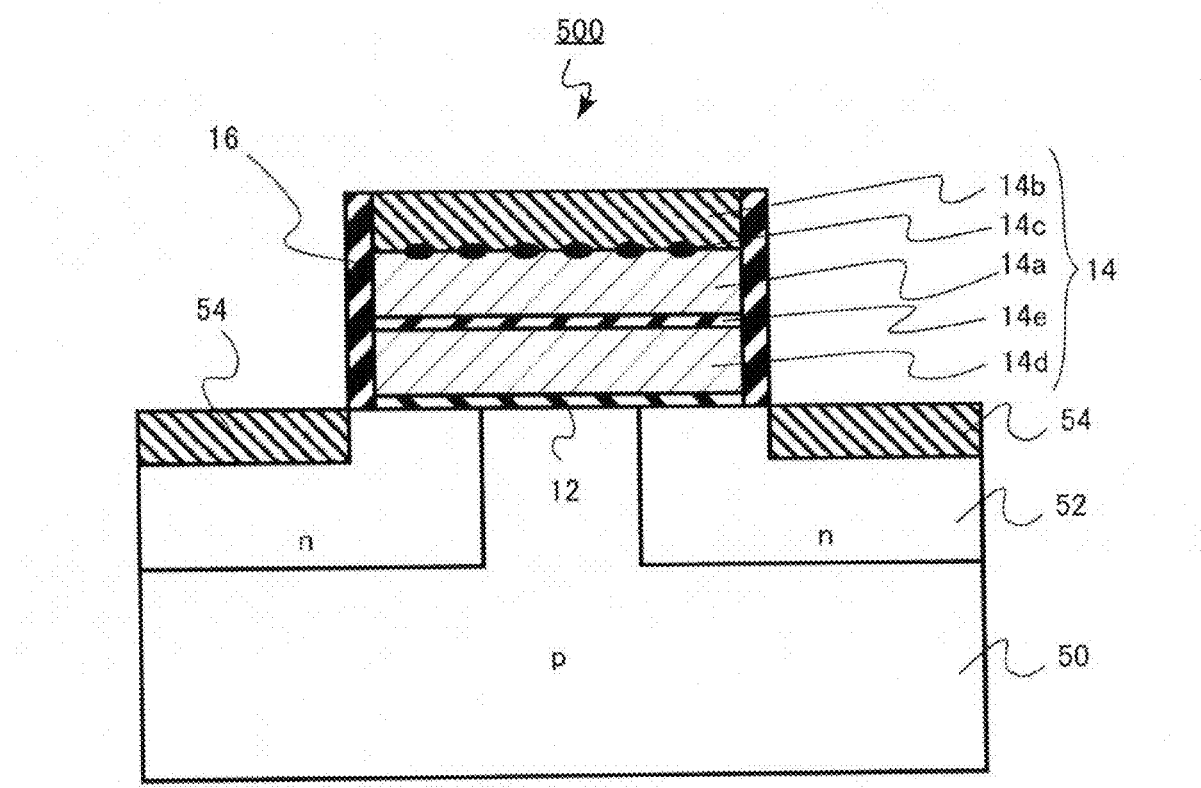
FIG. 17 is a schematic sectional view of a semiconductor device according to a fifth embodiment.

FIG. 17 is a schematic sectional view of a semiconductor device according to the present embodiment.

A NAND-type flash memory 500 includes the semiconductor layer 14a of a gate electrode 14, that is made of the polycrystalline p$^+$-type germanium (Ge), and the metal semiconductor compound layer 14b made of the nickel germanide.

The aggregation temperature of the nickel germanide on the polycrystalline p$^+$-type germanium is lower than that of the nickel silicide on the single-crystal silicon.

According to the NAND-type flash memory of the present embodiment, a high-speed operation and high reliability can be realized, as similar to the first embodiment, by providing the gate electrode having low resistance and high heat-resistance. Further, according to the method of manufacturing the NAND-type flash memory of the present embodiment, the method of manufacturing the above-described NAND-type flash memory can be simplified.

Still further, a heat treatment at 650° C. or more can be performed after the process of forming the silicide of the gate electrode, whereby process freedom can be improved. Therefore, higher efficiency and higher reliability of the NAND-type flash memory can be realized.

Still further, voltages of writing, reading and erasing of memory data can be set lower than that of a case where the semiconductor layer 14a is the p$^+$-type polycrystalline silicon.

While certain embodiments have been described, these embodiments have been presented by way of example only, and are not intended to limit the scope of the inventions. Indeed, the semiconductor device and the method of manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a substrate formed of a single-crystal silicon carbide first semiconductor;
   a gate insulating film formed on the substrate;
   a gate electrode including a layered structure of a semiconductor layer formed of a polycrystalline silicon second semiconductor and formed on the gate insulating film, and a metal semiconductor compound layer formed of a first metal semiconductor compound that is a reaction product of a metal and the second semiconductor; and
   electrodes formed of a second metal semiconductor compound that is a reaction product of the metal and the first semiconductor, and formed on the substrate with the gate electrode interposed therebetween,
   wherein an aggregation temperature of the first metal semiconductor compound on the polycrystalline silicon second semiconductor is lower than an aggregation temperature of the second metal semiconductor compound on the single-crystal silicon carbide first semiconductor, and
   a cluster-state high carbon concentration region is included in an interface between the semiconductor layer and the metal semiconductor compound layer.

2. The device according to claim 1, wherein the metal is nickel.

3. The device according to claim 1, wherein an average of diameters of the cluster-state high carbon concentration region is 1 nm or more and 30 nm or less.

4. The device according to claim 1, wherein a surface density of the cluster-state high carbon concentration region at the interface is $1 \times 10^{10}$ cm$^{-2}$ or more and $1 \times 10^{15}$ cm$^{-2}$ or less.

5. The device according to claim 1, wherein a surface density of the cluster-state high carbon concentration region at the interface is larger than a surface density of crystal grains of the first metal semiconductor compound.

6. A method of manufacturing the semiconductor device of claim 1, the method comprising:
   performing ion implantation of carbons into the polycrystalline silicon second semiconductor layer;
   performing a first heat treatment to cluster the carbons in the polycrystalline silicon second semiconductor layer;
   forming a metal film on the polycrystalline silicon second semiconductor layer; and
   performing a second heat treatment to cause a reaction between the polycrystalline silicon second semiconductor layer and the metal film to form the metal semiconductor compound layer.

7. The method according to claim 6, wherein a temperature of the first heat treatment is 700° C. or more and 1200° C. or less.

8. The method according to claim 6, wherein a dose amount of the carbons in the ion implantation of the carbons is 1e13 cm$^{-2}$ or more and 5e16 cm$^{-2}$ or less.

9. A method of manufacturing the semiconductor device of claim 1, the method comprising:
   forming the gate insulating film on the silicon carbide substrate;
   forming the polycrystalline silicon second semiconductor layer on the gate insulating film;
   performing ion implantation of carbons into the polycrystalline silicon second semiconductor layer;
   performing a first heat treatment to cluster the carbons in the polycrystalline silicon second semiconductor layer;
   patterning the polycrystalline silicon second semiconductor layer;
   forming a metal film on the polycrystalline silicon second semiconductor layer and on the silicon carbide substrate; and
   performing a second heat treatment to cause a reaction between the polycrystalline silicon second semiconductor layer and the metal film to form a first metal silicide film, and to cause a reaction between the silicon carbide substrate and the metal film to form a second metal silicide film.

10. The method according to claim 9, wherein the metal film is a nickel film.

11. The method according to claim 9, wherein a temperature of the first heat treatment is 700° C. or more and 1200° C. or less.

* * * * *